US008863383B2

(12) United States Patent
Ogata

(10) Patent No.: US 8,863,383 B2
(45) Date of Patent: Oct. 21, 2014

(54) INTEGRATED HEAT SPREADER AND METHOD OF FABRICATION

(75) Inventor: Kazuo Ogata, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 13/355,167

(22) Filed: Jan. 20, 2012

(65) Prior Publication Data
US 2012/0114859 A1 May 10, 2012

Related U.S. Application Data

(62) Division of application No. 12/046,383, filed on Mar. 11, 2008, now Pat. No. 8,136,244.

(51) Int. Cl.
*B21D 53/02* (2006.01)
*H01L 21/48* (2006.01)
*H01L 23/367* (2006.01)
*H01L 23/42* (2006.01)

(52) U.S. Cl.
CPC ... *H01L 23/3675* (2013.01); *H01L 2224/16225* (2013.01); *H01L 2224/73253* (2013.01); *H01L 21/4878* (2013.01); *H01L 23/42* (2013.01); *H01L 2224/73204* (2013.01); *H01L 2224/32245* (2013.01); *H01L 2224/32225* (2013.01)
USPC ........... 29/890.03; 29/592.1; 29/557; 29/558; 29/832; 257/678; 257/706; 257/711; 257/730; 361/679.54

(58) Field of Classification Search
USPC ..................... 29/890.03, 557, 558, 592, 832; 257/678, 706, 711, 730; 361/679.54
See application file for complete search history.

(56) References Cited

U.S. PATENT DOCUMENTS

| 5,611,393 | A | * | 3/1997 | Vasconcelos et al. | ........ 165/80.3 |
| 5,700,724 | A | * | 12/1997 | Shipe | ............. 438/121 |
| 5,940,269 | A | * | 8/1999 | Ko et al. | ........ 361/697 |
| 6,709,898 | B1 | * | 3/2004 | Ma et al. | ........ 438/122 |
| 8,136,244 | B2 | | 3/2012 | Ogata | |

FOREIGN PATENT DOCUMENTS

JP        2001-274499 A    10/2001

* cited by examiner

*Primary Examiner* — Peter DungBa Vo
*Assistant Examiner* — Azm Parvez
(74) *Attorney, Agent, or Firm* — Winkle PLLC

(57) ABSTRACT

An integrated heat spreader is disclosed in which grooves are formed in a recess of the heat spreader to enhance the stiffness and strength of the integrated heat spreader without increasing production costs or complexity. The integrated heat spreader may be fabricated by providing a metal strip having raised portions thereon to provide a recess therebetween, forming grooves on a bottom surface of the recess, where the grooves extend along a periphery of the bottom surface which is substantially free of the raised portions, and subsequently singulating an integrated heat spreader from the metal strip.

16 Claims, 4 Drawing Sheets

_US 8,863,383 B2_

INTEGRATED HEAT SPREADER AND METHOD OF FABRICATION

CROSS REFERENCE TO RELATED APPLICATION

This application is a divisional of U.S. patent application Ser. No. 12/046,383 filed Mar. 11, 2008.

BACKGROUND

1. Technical Field

Embodiments of the invention relate to heat dissipation devices for electronic packages, and more particularly to an integrated heat spreader. Disclosed embodiments also include a method of fabricating the integrated heat spreader structure using commonly available press equipment.

2. Description of Related Art

Currently, integrated heat spreaders are fabricated from copper strip which has single plane thicknesses. The integrated heat spreaders are typically fabricated from raw copper strip by cold forging processes to form raised rims around the integrated heat spreaders. Such processes involve heavy press equipment, e.g. a 250 to 400 ton press, which is less commonly available. Further, heavy press equipment requires substantial capital investment, thereby constraining flexibility in volume expansion. Lighter press equipment may not be appropriate especially if a large size heat spreader, e.g. 50 mm×50 mm is desired.

Integrated heat spreaders fabricated from raw copper strip require plating with nickel or other materials to prevent corrosion. However, where the integrated heat spreaders are fabricated using cold forging, nickel plating can only be performed on the completed heat spreaders as the press equipment used in cold forging may damage any pre-plated nickel due to excessive pressure exerted by the press equipment.

DETAILED DESCRIPTION OF ILLUSTRATIVE EMBODIMENTS

Figure 1:
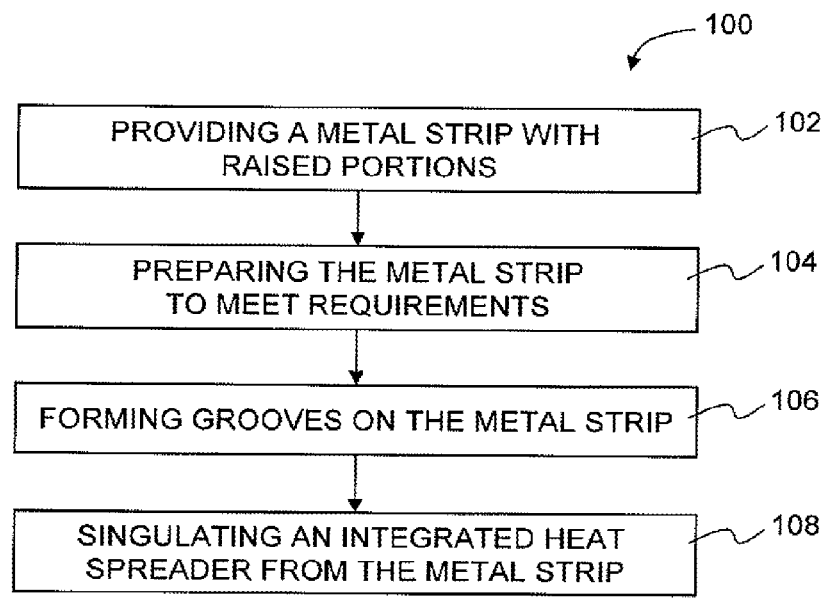
FIG. 1 is a flow sequence of fabricating an integrated heat spreader according to one embodiment of the invention.

In the following description, numerous specific details are set forth in order to provide a thorough understanding of various illustrative embodiments of the present invention. It will be understood, however, to one skilled in the art, that embodiments of the present invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Figure 3:
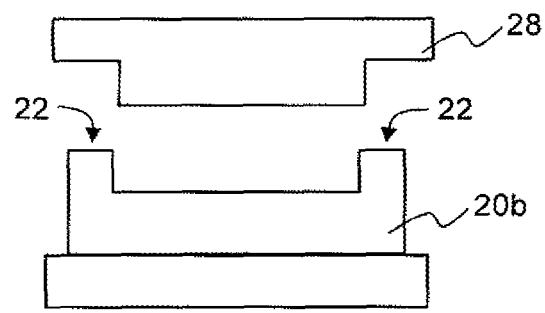
FIG. 3 illustrates stamping the metal strip by a light ton press.
Figure 4:
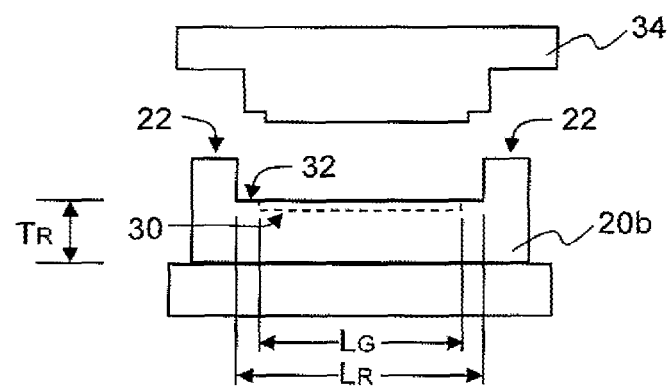
FIG. 4 illustrates forming grooves in the metal strip according to one embodiment of the invention.
Figure 5:
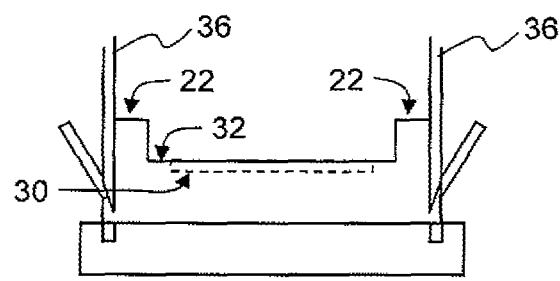
FIG. 5 illustrates singulating an integrated heat spreader from the metal strip according to one embodiment of the invention.

FIG. 1 is a flow chart summarizing a sequence 100 of fabricating an integrated heat spreader according to one embodiment of the invention. The process sequence 100 will be described with further reference to FIGS. 3 to 5 illustrating various process outputs obtained during the process sequence 100 of FIG. 1.

The process sequence 100 begins with providing a metal strip 20b with raised portions 22 (block 102). The metal strip 20b may be dual or multiple gauge, in which the strip 20b has two or more cross-sectional thicknesses or raised portions interposing a recess therebetween. The metal strip 20b may comprise copper, aluminum, or other suitable metals or metal alloys.

Figure 2D:
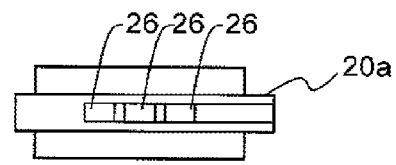
FIG. 2D is a top view of the metal strip at the stamping table.
Figure 2A:
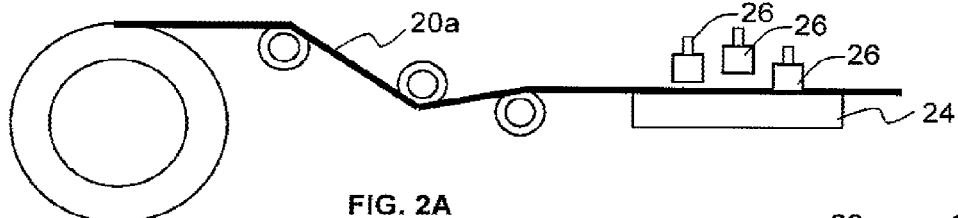
FIG. 2A illustrates a stamping process for forming a dual gauge metal strip from a single gauge metal strip.
Figures 2B, 2C:
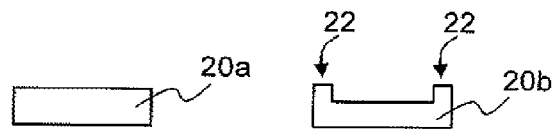
FIG. 2B is a side view of a metal strip prior to the stamping process of FIG. 2A.
FIG. 2C is a side view of the metal strip after the stamping process of FIG. 2A.

In order to provide the dual gauge metal strip 20b, a metal strip 20a having a single thickness, may be subject to a stamping or a rolling process to form multiple raised portions 22. FIG. 2 illustrates a stamping process in which a single gauge (single thickness) metal strip 20a is processed into a dual gauge (double thickness) metal strip 20b having a lid-shape profile. The metal strip 20a may be passed through a stamping table 24 where multiple (e.g. three) stamping dies 26 or rollers are operable to form two raised portions 22 from the metal strip 20a. FIG. 2A illustrates a stamping process involving a single stamping step for forming a dual gauge metal strip 20b from a single gauge metal strip 20a. FIGS. 2B and 2C are side views of the metal strip prior to and after the stamping process. FIG. 2D is a top view of the metal strip 20a at the stamping table 24.

If required, a dual gauge metal strip 20b having a hat-shape profile may be fabricated using two or more stamping steps. A first stamping step may be required to form two raised portions 22 interposing a recess as illustrated in FIG. 2C, and a second stamping step may be required to form a brim of the hat shape.

After providing a metal strip 20b with dual or multiple raised portions 22, the process sequence 100 may then proceed to preparing the metal strip 20b to meet specific physical requirements (block 104), including but not limited to flatness and dimensions. To this purpose, the metal strip 20b may be stamped or rolled by a light ton press 28, e.g. 80 ton to 125 ton, to substantially even surfaces of the raised portions or the recess therebetween or both (see FIG. 3). Dimensional requirements of the integrated heat spreader may also be adjusted through stamping.

The process sequence 100 may then proceed to forming a plurality of grooves 30 on a bottom surface 32 of the recess (block 106). The bottom surface 32 of the recess has a periphery, wherein a portion is surrounded by the raised portions 22 while the remaining portion of the periphery is substantially free of the raised portions 22. Grooves 30 may be formed along the portion of the periphery of the bottom surface 32 which is substantially free of the raised portions 22. The grooves 30 may extend partially between the raised portions 22. In one embodiment, the length of the grooves ($L_G$) may be between about 70% to about 90% of the recess length ($L_R$) which refers to the direct distance between the raised portions 22. To this purpose, cutting knives 34 or cutting tools may be arranged at appropriate positions and operable to form grooves 30 on the bottom surface 32 of the recess (see FIG. 4). The grooves 30 may partially penetrate the bottom surface 32 of the recess at a depth between one tenth to one quarter of a height or thickness ($T_R$) of the metal strip 20b at the recess. In the embodiments of the appended drawings, the grooves 30 are illustrated as single slits arranged on opposite sides of the periphery of the bottom surface 32 in the recess. In other embodiments, the grooves 30 may be in the form of non-contiguous slits or perforations.

After the grooves 30 are formed, the process sequence 100 may then proceed with singulating an integrated heat spreader 40 from the metal strip 20b (block 108). To this, the metal strip 20b may be severed at the raised portions 22 according to dimensional requirements to separate an integrated heat spreader 40 from the metal strip 20b (see FIG. 5). The integrated heat spreader 40 singulated from the metal strip 20b may be rendered for further processing or for use as required.

After singulation, the integrated heat spreader 40 may be plated with a corrosion resistant material, e.g. nickel, using methods such as electrical or electroless plating to protect the heat spreader from adverse environmental effects. Alternatively, the corrosion resistant material may be pre-plated on the metal strip 20b prior to fabricating the integrated heat spreader 40. Pre-plating offers cost advantages as the plating is performed on the metal strip 20b from which multiple integrated heat spreaders 40 may be fabricated. In embodiments where the metal strip 20b is pre-plated with a corrosion material, the completed integrated heat spreader 40 would include side edges, along the singulation sites, which are substantially free of the plated material.

If required, the integrated heat spreader 40 may also be spot plated with a material having high electrical conductivity, e.g. gold, to improve the wettability of a thermal interface material 62 interposed between the integrated heat spreader 40 and a semiconductor die 60.

Stop

Figure 6A:
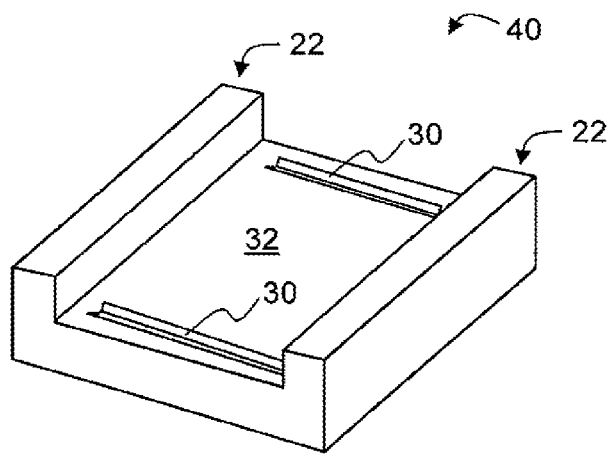
FIG. 6A is a perspective view of an integrated heat spreader having a lid-shape cross-sectional profile.
Figure 7A:
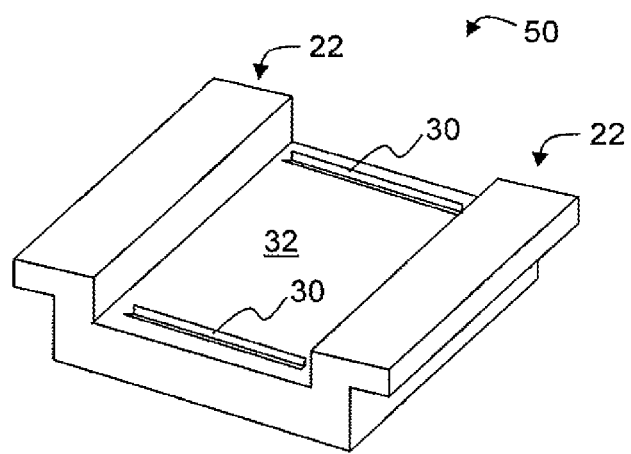
FIG. 7A is a perspective view of an integrated heat spreader having a hat-shape cross-sectional profile.

Reference is made to FIG. 6A illustrating a perspective view of an integrated heat spreader 40 having a lid-shape cross-sectional profile. Reference is also made to FIG. 7A illustrating a perspective view of an integrated heat spreader 50 having a hat shape cross-sectional profile. The integrated heat spreader 40, 50 has a center region surrounded by an outer region which includes at least raised portions 22 interposing the center region to provide a recess therebetween. The bottom surface 32 of the recess includes a plurality of grooves 30 extending along a portion of its periphery which is substantially free of the raised portions 22. The grooves 30 may be arranged proximate to the edge of the integrated heat spreader 40, 50 such that when the integrated heat spreader 40, 50 is mounted on a semiconductor die 60, the grooves 30 do not overlay the semiconductor die 60. Accordingly, dimensions of the center region of the integrated heat spreader 40, 50 may be larger than a top surface of the semiconductor die 60.

Figure 6B:
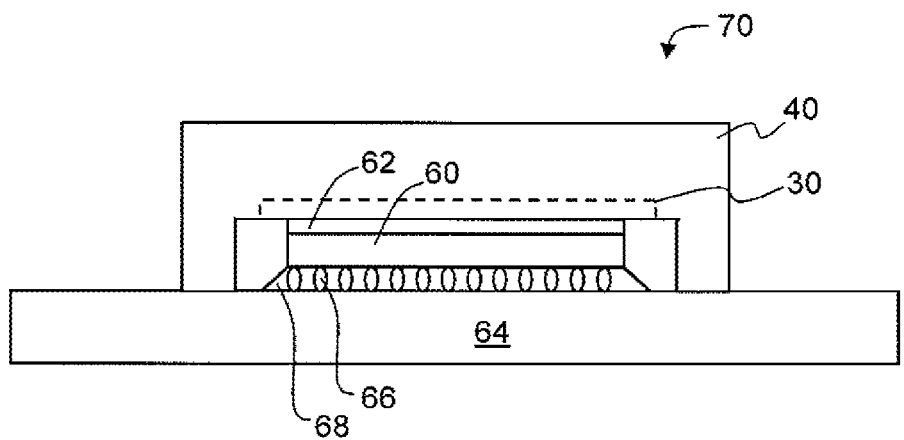
FIG. 6B is a side view of a package incorporating the integrated heat spreader of FIG. 6A.
Figure 7B:
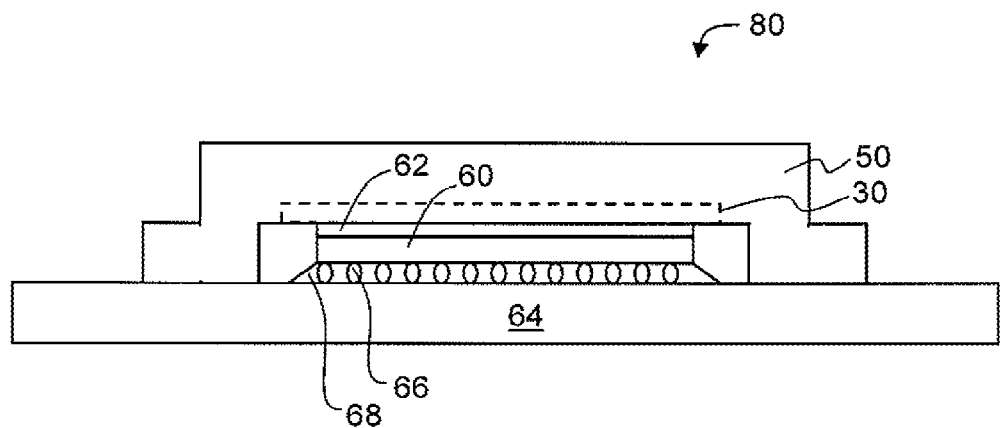
FIG. 7B is a side view of a package incorporating the integrated heat spreader of FIG. 7A.

Reference is made to FIGS. 6B and 7B illustrating side views of semiconductor packages 70, 80 incorporating the integrated heat spreaders 40, 50 of FIGS. 6A and 7A respectively. The integrated heat spreader 40, 50 may be mounted on a semiconductor die 60 using a thermal interface material 62 interposed therebetween to increase thermal transfer efficiency. The semiconductor die 60 is mounted on a package substrate 64 using interconnects 66, e.g. solder balls, and may be provided with an underfill material 68 to protect the interconnects 66 from the ambient environment. If power dissipation requirements are high, an external heat sink (not shown) may be mounted on the integrated heat spreader 40, 50.

Embodiments of the invention are advantageous in reinforcing the mechanical strength of the package substrate. When organic packages are subjected to temperature changes, the substrates are prone to (concave or convex) warpage due to mismatch in coefficients of thermal expansion (CTE) of the constituent materials. The integrated heat spreader prevents substrate warpage by providing mechanical reinforcement to the substrate. Further, grooves formed in the recess of the integrated heat spreader are advantageous in improving the stiffness of the integrated heat spreader, thereby also improving the mechanical strength of the package.

Further advantages of embodiments of the invention include lower manufacturing costs due to the following factors. Lighter press equipment, e.g., 80 to 125 ton press which is commonly available in the industry may be used even for large-size integrated heat spreader, e.g. 50 mm×50 mm without compromising the stiffness and strength of the integrated heat spreader. Further, the multiple gauge metal strip may be pre-plated prior to fabricating the integrated heat spreader to increase production capacity and yet decrease plating costs.

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A method for making an integrated heat spreader comprising:
   providing a metal strip having at least two raised portions thereon to provide a recess therebetween,
   forming a plurality of grooves on a bottom surface of the recess, the grooves extending along a periphery of the bottom surface which is substantially free of the raised portions, wherein the plurality of grooves each have a length which is less than a length between the at least two raised portions, and wherein the grooves extend into, but not through the metal strip recess; and
   singulating the integrated heat spreader from the metal strip.

2. The method of claim 1, wherein singulating the integrated heat spreader is by cutting the metal strip at the raised portions.

3. The method of claim 2, further comprising plating the metal strip with a corrosion resistant material prior to forming the grooves.

4. The method of claim 3, wherein each of the plurality of grooves has depth between one tenth to one quarter of a thickness of the metal strip at the recess.

5. The method of claim 4, wherein the heat spreader is plated with a corrosion resistant material prior to forming the grooves.

6. The method of claim 4, wherein a side surface of each of the raised portions is substantially free of the corrosion resistant material.

7. The method of claim 6, wherein a cross-sectional profile of the heat spreader is one of a lid shape and a hat shape.

8. The method of claim 6, wherein the grooves formed on the bottom are non-contiguous.

9. A method for making an integrated heat spreader comprising:
   providing a metal strip having at least two raised portions thereon to provide a recess therebetween,
   forming a plurality of grooves on a bottom surface of the recess, the grooves extending along a periphery of the bottom surface which is substantially free of the raised portions, wherein the grooves have a length between about 70% to 90% of a length between the at least two raised portions, and wherein the grooves extend into, but not through the metal strip recess; and singulating the integrated heat spreader from the metal strip.

10. The method of claim 9, wherein singulating the integrated heat spreader is by cutting the metal strip at the raised portions.

11. The method of claim 10, further comprising plating the metal strip with a corrosion resistant material prior to forming the grooves.

12. The method of claim 11, wherein each of the plurality of grooves has depth between one tenth to one quarter of a thickness of the metal strip at the recess.

13. The method of claim 12, wherein the heat spreader is plated with a corrosion resistant material prior to forming the grooves.

14. The method of claim 12, wherein a side surface of each of the raised portions is substantially free of the corrosion resistant material.

15. The method of claim 14, wherein a cross-sectional profile of the heat spreader is one of a lid shape and a hat shape.

16. The method of claim 14, wherein the grooves formed on the bottom are non-contiguous.

* * * * *